United States Patent
Tanaka

(10) Patent No.: US 9,952,251 B2
(45) Date of Patent: Apr. 24, 2018

(54) PHYSICAL QUANTITY SENSOR, ELECTRONIC DEVICE, AND MOVING OBJECT

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 158 days.

(21) Appl. No.: 14/451,816

(22) Filed: Aug. 5, 2014

(65) Prior Publication Data
US 2015/0040667 A1    Feb. 12, 2015

(30) Foreign Application Priority Data
Aug. 6, 2013   (JP) ................................ 2013-163000

(51) Int. Cl.
| | | |
|---|---|---|
| *G01P 15/125* | (2006.01) | |
| *B81B 3/00* | (2006.01) | |
| *G01P 15/08* | (2006.01) | |

(52) U.S. Cl.
CPC .......... *G01P 15/125* (2013.01); *B81B 3/0008* (2013.01); *B81B 2203/04* (2013.01); *G01P 2015/0831* (2013.01)

(58) Field of Classification Search
CPC .......... G01P 15/125; G01P 2015/0831; G01P 2015/0834; G01P 2015/0862
USPC ...................................................... 73/514.32
See application file for complete search history.

(56) References Cited

U.S. PATENT DOCUMENTS

| | | | |
|---|---|---|---|
| 5,367,429 A | 11/1994 | Tsuchitani et al. | |
| 7,121,141 B2 | 10/2006 | McNeil | |
| 2004/0160232 A1* | 8/2004 | Yue ....................... | G01P 15/131 |
| | | | 324/660 |
| 2008/0173091 A1* | 7/2008 | McNeil ................. | G01P 15/125 |
| | | | 73/514.32 |
| 2011/0056297 A1 | 3/2011 | Classen | |
| 2013/0192370 A1 | 8/2013 | Yoda | |

FOREIGN PATENT DOCUMENTS

| | | |
|---|---|---|
| CN | 103226153 A | 7/2013 |
| JP | H05-172846 A | 7/1993 |
| JP | 2007-298405 A | 11/2007 |
| JP | 2013-003125 A | 1/2013 |
| JP | 2013-011549 A | 1/2013 |

* cited by examiner

*Primary Examiner* — Benjamin Schmitt
(74) *Attorney, Agent, or Firm* — Harness, Dickey & Pierce, P.L.C.

(57) ABSTRACT

A physical quantity sensor according to the embodiment includes: a substrate; a movable body including a movable electrode portion; and a support which supports the movable body around a first shaft to be displaced, in which, when the movable body is divided into a first portion and a second portion with the first shaft as a boundary, the physical quantity sensor includes a first fixed electrode portion which is disposed on the substrate to oppose the first portion, and a second fixed electrode portion which is disposed on the substrate to oppose the second portion, and a guard portion which suppresses an electrostatic force generated between the movable body and the substrate is provided in an inter-electrode area between the first fixed electrode portion and the second fixed electrode portion, on the substrate.

10 Claims, 11 Drawing Sheets

PHYSICAL QUANTITY SENSOR, ELECTRONIC DEVICE, AND MOVING OBJECT

CROSS-REFERENCE TO RELATED APPLICATIONS

This application claims priority to Japanese Patent Application No. 2013-163000 filed on Aug. 6, 2013. The entire disclosure of Japanese Patent Application No. 2013-163000 is hereby incorporated herein by reference.

BACKGROUND

1. Technical Field

The present invention relates to a physical quantity sensor, an electronic device, and a moving object.

2. Related Art

In recent years, a physical quantity sensor for detecting a physical quantity such as acceleration has been developed by using silicon micro electro mechanical systems (MEMS), for example.

The physical quantity sensor, for example, includes a substrate, a fixed electrode portion fixed to the substrate, and a movable body including a movable electrode portion disposed to oppose the fixed electrode portion, and detects the physical quantity such as acceleration based on electrostatic capacitance between the movable electrode portion and the fixed electrode portion.

In the physical quantity sensor, the movable body may be stuck to the substrate due to the movable body being pulled to the substrate side by the electrostatic force, due to generation of a difference in potential between the movable body and the substrate, when manufacturing the physical quantity sensor, for example. Particularly, when performing anode bonding of a cover (cap) and the substrate for sealing the movable body, a great difference in potential is generated between the movable body and the substrate.

In order to prevent the movable body from being stuck to the substrate, U.S. Pat. No. 7,121,141 Specification, for example, discloses a physical quantity sensor which comes in contact with a shield before a fixed electrode comes in contact with a movable body (test mass).

However, in the technology disclosed in U.S. Pat. No. 7,121,141 Specification, since the substrate is exposed in an area between two fixed electrodes, the movable body may be stuck to the substrate due to an electrostatic force between the area to which the substrate is exposed and the movable body. Particularly, in the physical quantity sensor disclosed in U.S. Pat. No. 7,121,141 Specification, since the area to which the substrate is exposed opposes a torsion bar having low rigidity, the movable body may be easily stuck to the substrate.

SUMMARY

An advantage of some aspects of the invention is to provide a physical quantity sensor which can prevent a movable body from being stuck to a substrate. Another advantage of some aspects of the invention is to provide an electronic device and a moving object including the physical quantity sensor described above.

The invention can be implemented as the following forms or application examples.

Application Example 1

A physical quantity sensor according to this application example includes: a substrate; a movable body including a movable electrode portion; and a support which supports the movable body around a first shaft to be displaced, in which, when the movable body is divided into a first portion and a second portion with the first shaft as a boundary, the physical quantity sensor includes a first fixed electrode portion which is disposed on the substrate to oppose the first portion, and a second fixed electrode portion which is disposed on the substrate to oppose the second portion, and a guard portion which suppresses an electrostatic force generated between the movable body and the substrate is provided in an inter-electrode area between the first fixed electrode portion and the second fixed electrode portion, on the substrate.

According to the physical quantity sensor of this application example, it is possible to suppress an electrostatic force acting between the movable body and the substrate and to prevent the movable body from being stuck to the substrate.

Application Example 2

In the physical quantity sensor according to the application example described above, the guard portion may be provided in a position overlapped with the support on the substrate in a plan view.

According to the physical quantity sensor of this application example, it is possible to suppress an electrostatic force acting between the support and the substrate and to prevent the movable body from being stuck to the substrate.

Application Example 3

In the physical quantity sensor according to the application example described above, the guard portion may be provided in a position overlapped with the movable body in a plan view and outside the first fixed electrode portion, the second fixed electrode portion, and the inter-electrode area.

According to the physical quantity sensor of this application example, it is possible to suppress an electrostatic force acting between the movable body and the substrate and to prevent the movable body from being stuck to the substrate.

Application Example 4

In the physical quantity sensor according to the application example described above, the guard portion may be an electrode electrically connected to the movable body.

According to the physical quantity sensor of this application example, it is possible to suppress an electrostatic force acting between the movable body and the substrate and to prevent the movable body from being stuck to the substrate.

In the description according to the invention, a phrase "electrically connected" is used, for example, to describe, "a specific member (hereinafter, referred to as a "B member") which is "electrically connected" to another specific member (hereinafter, referred to as an "A member")". In the description according to the invention, in a case of this example, the phrase "electrically connected" is used in both cases when the A member and the B member directly come in contact with each other and are electrically connected to each other, and when the A member and the B member are electrically connected through another member.

Application Example 5

In the physical quantity sensor according to the application example described above, the electrode of the guard portion may be provided in an inner bottom surface of a groove portion provided on the substrate.

According to the physical quantity sensor of this application example, it is possible to suppress an electrostatic force acting between the movable body and the substrate and to prevent the movable body from being stuck to the substrate.

Application Example 6

In the physical quantity sensor according to the application example described above, groove portions may be provided in an area between the electrode and the first fixed electrode portion of the substrate, and an area between the electrode and the second fixed electrode portion of the substrate.

According to the physical quantity sensor of this application example, it is possible to suppress an electrostatic force acting between the movable body and the substrate and to prevent the movable body from being stuck to the substrate.

Application Example 7

In the physical quantity sensor according to the application example described above, the number of electrodes adjacent to the first fixed electrode portion and the number of electrodes adjacent to the second fixed electrode portion may be equivalent to each other.

According to the physical quantity sensor of this application example, it is possible to easily set parasitic capacitance generated between the first fixed electrode portion and the electrodes, and capacitance generated between the second fixed electrode portion and the electrodes, to be equivalent to each other. Accordingly, it is possible to remove an influence of the parasitic capacitance on the first fixed electrode portion and an influence of the parasitic capacitance on the second fixed electrode portion, by using the differential detection system.

Application Example 8

In the physical quantity sensor according to the application example described above, a protrusion portion which is protruded toward the movable body may be provided on at least one of the electrode, the first fixed electrode portion and the second fixed electrode portion.

According to the physical quantity sensor of this application example, it is possible to prevent the movable body from being stuck to the substrate.

Application Example 9

In the physical quantity sensor according to the application example described above, the guard portion may be a groove portion.

According to the physical quantity sensor of this application example, it is possible to suppress an electrostatic force acting between the movable body and the substrate and to prevent the movable body from being stuck to the substrate.

Application Example 10

A physical quantity sensor according to this application example includes: a substrate; a movable body including a movable electrode portion; a support which supports the movable body around a first shaft to be displaced; and fixed electrode portions disposed on the substrate to oppose the movable electrode portion, in which a guard portion which suppresses an electrostatic force generated between the support and the substrate is provided in an area overlapped with the support on the substrate, in a plan view.

According to the physical quantity sensor of this application example, it is possible to suppress an electrostatic force acting between the support and the substrate and to prevent the movable body from being stuck to the substrate.

Application Example 11

An electronic device according to this application example includes the physical quantity sensor according to any one of the application examples described above.

Since the electronic device includes the physical quantity sensor according to any one of the application examples described above, it is possible to obtain high reliability.

Application Example 12

A moving object according to this application example includes the physical quantity sensor according to any one of the application examples described above.

Since the moving object includes the physical quantity sensor according to any one of the application examples described above, it is possible to obtain high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments which will be described hereinafter do not unduly limit the content of the invention according to the aspects. All configurations which will be described hereinafter are not necessarily compulsory constituent elements of the invention.

1. First Embodiment

1.1. Physical Quantity Sensor

Figure 1:
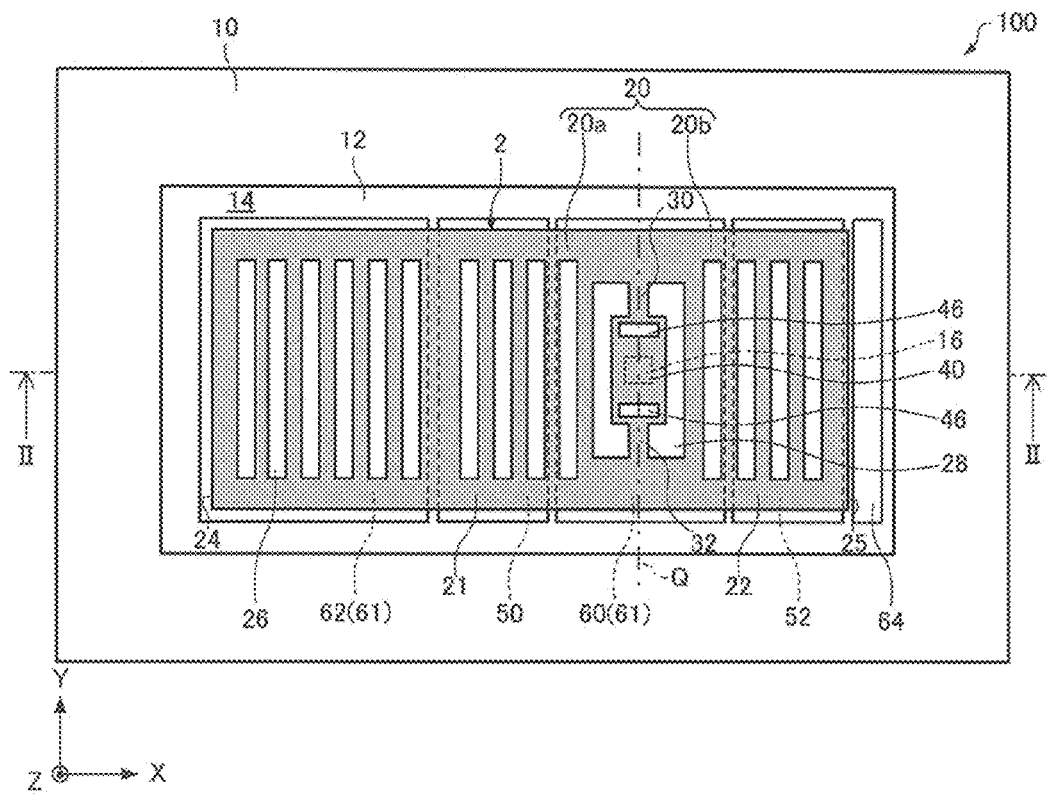
FIG. 1 is a plan view schematically showing a physical quantity sensor according to a first embodiment.
Figure 2:
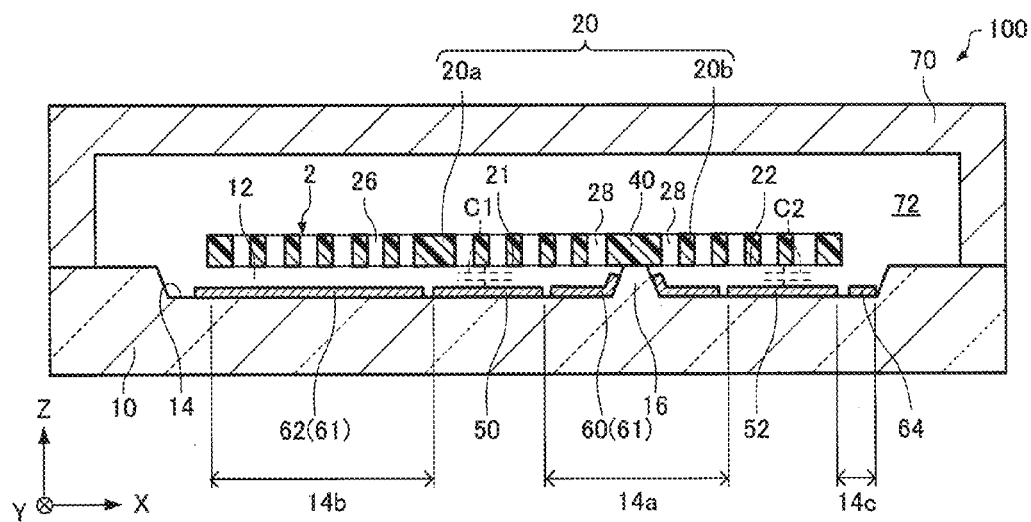
FIG. 2 is a cross-sectional view schematically showing the physical quantity sensor according to the first embodiment.

First, a physical quantity sensor according to a first embodiment will be described with reference to the drawings. FIG. 1 is a plan view schematically showing a physical quantity sensor 100 according to the first embodiment. FIG. 2 is a cross-sectional view taken along line II-II of FIG. 1 and schematically showing the physical quantity sensor 100 according to the first embodiment. For convenience, a cover 70 is omitted in FIG. 1. In addition, in FIGS. 1 and 2, an X axis, a Y axis, and a Z axis are shown as three axes which are orthogonal with respect to each other, and the X axis, the Y axis, and the Z axis are shown in the same manner in the drawings which will be described later.

As shown in FIG. 1 and FIG. 2, the physical quantity sensor 100 includes a substrate 10, a movable body 20, a support 30, a fixed portion 40, fixed electrode portions 50 and 52, guard portions 60 and 62, an electrode 64, and the cover 70. Hereinafter, an example in which the physical quantity sensor 100 is an acceleration sensor (capacitance type MEMS acceleration sensor) for detecting acceleration in a vertical direction (Z axis direction) will be described.

A material of the substrate 10 is, for example, an insulating material such as glass or the like. By using the insulating material such as glass for the substrate 10 and using a semiconductor material such as silicon for the movable body 20, for example, it is possible to easily electrically insulate both components from each other and to simplify a sensor structure.

A recess 12 is formed on the substrate 10. The movable body 20 and the supports 30 and 32 are provided above the recess 12 with a gap interposed therebetween. In the example shown in FIG. 1, a planar shape (shape when seen from the Z axis direction) of the recess 12 is a rectangular shape.

The substrate 10 includes a post portion 16 provided on a bottom surface (surface of the substrate 10 for regulating the recess 12) 14 of the recess 12. The post portion 16 protrudes toward the upper portion (positive Z axis direction) with respect to the bottom surface 14. A height of the post portion 16 and a depth of the recess 12 are, for example, equivalent to each other. The wire (not shown) for applying a predetermined potential to the movable body 20 is provided on the post portion 16.

The movable body 20 can be displaced around a support shaft (first shaft) Q. In detail, when the acceleration is applied in the vertical direction (Z axis direction), the movable body 20 seesaws using the support shaft Q determined by the supports 30 and 32 as a rotation shaft (rocking shaft). The support shaft Q is parallel with the Y axis, for example. A planar shape of the movable body 20 is a rectangular shape, for example. A thickness (size in the Z axis direction) of the movable body 20 is constant, for example.

The movable body 20 includes a first seesaw piece (first portion) 20a and a second seesaw piece (second portion) 20b. The first seesaw piece 20a is one (portion positioned at the left in FIG. 1) of two portions of the movable body 20 partitioned by the support shaft Q in a plan view. The second seesaw piece 20b is the other one (portion positioned at the right in FIG. 1) of two portions of the movable body 20 partitioned by the support shaft Q in a plan view. That is, the movable body 20 is divided into the first seesaw piece 20a and the second seesaw piece 20b with the support shaft Q as a boundary.

When acceleration in the vertical direction (for example, gravity acceleration) is applied to the movable body 20, for example, a rotation moment (moment of force) for each of the first seesaw piece 20a and the second seesaw piece 20b is generated. Herein, when the rotation moment (for example, counter-clockwise rotation moment) of the first seesaw piece 20a and the rotation moment (for example, clockwise rotation moment) of the second seesaw piece 20b are balanced, the inclination of the movable body 20 does not change and it is difficult to detect the acceleration. Accordingly, the movable body 20 is designed so that the rotation moment of the first seesaw piece 20a and the rotation moment of the second seesaw piece 20b are not balanced to have a predetermined inclination of the movable body 20, when the acceleration in the vertical direction is applied.

In the physical quantity sensor 100, by disposing the support shaft Q in a position deviated from the center (center of gravity) of the movable body 20 (by differentiating distances from the support shaft Q to distal ends of the seesaw pieces 20a and 20b), the seesaw pieces 20a and 20b have different masses from each other. That is, one side (first seesaw piece 20a) and the other side (second seesaw piece 20b) of the movable body 20 have different masses from each other with the support shaft Q as a boundary. In the example shown in the drawing, a distance from the support shaft Q to an end surface 24 of the first seesaw piece 20a is greater than a distance from the support shaft Q to an end surface 25 of the second seesaw piece 20b. A thickness of the first seesaw piece 20a and a thickness of the second seesaw piece 20b are equivalent to each other. Accordingly, the mass of the first seesaw piece 20a is greater than the mass of the second seesaw piece 20b. As described above, the seesaw pieces 20a and 20b have different masses from each other, and therefore when the acceleration in the vertical direction is applied, it is possible to have the rotation moment of the first seesaw piece 20a and the rotation moment of the second seesaw piece 20b not be balanced. Accordingly, when the acceleration in the vertical direction is applied, it is possible to have a predetermined inclination of the movable body 20.

Although not shown, the seesaw pieces 20a and 20b may have different masses from each other by disposing the support shaft Q at the center of the movable body 20 and setting the thicknesses of the seesaw pieces 20a and 20b different from each other. Even in this case, when the acceleration in the vertical direction is applied, it is possible to have a predetermined inclination of the movable body 20.

The movable body 20 is provided to be separated from the substrate 10. The movable body 20 is provided on the recess 12. In the example shown in the drawing, a gap is provided between the movable body 20 and the substrate 10. In addition, the movable body 20 is provided to be separated from the fixed portion 40 by the supports 30 and 32. Accordingly, the movable body 20 can be seesawed.

The movable body 20 includes a first movable electrode portion 21 and a second movable electrode portion 22 which are provided with the support shaft Q as a boundary. The first movable electrode portion 21 is provided on the first seesaw piece 20a. The second movable electrode portion 22 is provided on the second seesaw piece 20b.

The first movable electrode portion 21 is a portion overlapping the first fixed electrode portion 50 on the movable body 20, in a plan view. The first movable electrode portion 21 forms capacitance C1 between the first movable electrode portion and the first fixed electrode portion 50. That is, the capacitance C1 is formed by the first movable electrode portion 21 and the first fixed electrode portion 50.

The second movable electrode portion 22 is a portion overlapping the second fixed electrode portion 52 on the movable body 20, in a plan view. The second movable electrode portion 22 forms capacitance C2 between the second movable electrode portion and the second fixed electrode portion 52. That is, the capacitance C2 is formed by the second movable electrode portion 22 and the second fixed electrode portion 52. In the physical quantity sensor 100, by configuring the movable body 20 with a conductive material (silicon to which an impurity is doped), the movable electrode portions 21 and 22 are provided. That is, the first seesaw piece 20a functions as the first movable electrode portion 21 and the second seesaw piece 20b functions as the second movable electrode portion 22.

The capacitance C1 and capacitance C2 are configured so as to be equivalent to each other in a horizontal state of the movable body 20 shown in FIG. 2, for example. The movable electrode portions 21 and 22 change the positions thereof according to the movement of the movable body 20. The capacitances C1 and C2 change according to the positions of the movable electrode portions 21 and 22. A predetermined potential is applied to the movable body 20 through the supports 30 and 32.

A slit portion 26 which penetrates through the movable body 20 is formed on the movable body 20. Accordingly, it is possible to reduce an influence of air (resistance of air) when swinging of the movable body 20. In the example shown in the drawing, a plurality of the slit portions 26 are provided.

An opening portion 28 is provided on the movable body 20. The supports 30 and 32 and the fixed portion 40 are provided on the opening portion 28. The movable body 20 is connected to the fixed portion 40 through the supports 30 and 32.

The supports 30 and 32 support the movable body 20 so as to be displaced around the support shaft Q. The supports and 32 function as torsion springs (twist springs). Accordingly, the supports 30 and 32 may have a strong restoring force with respect to torsional deformation generated on the supports 30 and 32 due to seesawing of the movable body 20.

The supports 30 and 32 are disposed on the support shaft Q in a plan view. The supports 30 and 32 connect the fixed portion 40 and the movable body 20 to each other. The supports 30 and 32 are extended along the support shaft Q. The support 30 is extended in a positive Y axis direction from the fixed portion 40. The support 32 is extended in a negative Y axis direction from the fixed portion 40.

The fixed portion 40 is provided on the opening portion 28. The fixed portion 40 is provided on the support shaft Q in a plan view. The fixed portion 40 is bonded to the post portion 16 of the substrate 10. In the example shown in the drawing, the center portion of the fixed portion 40 is bonded to the post portion 16.

A penetration hole 46 is formed on a portion of the fixed portion 40 separated from the substrate 10. The penetration hole 46 is disposed on the support shaft Q in a plan view. By providing the penetration hole 46 on the fixed portion 40, it is possible to reduce an influence of stress generated due to a difference between a coefficient of thermal expansion of the substrate 10 and a coefficient of thermal expansion of a structure 2, stress applied to a device when mounting the device, or the like, on the supports 30 and 32.

The movable body 20, the supports 30 and 32, and the fixed portion 40 are integrally provided. The movable body 20, the supports 30 and 32, and the fixed portion 40 are integrally provided by patterning one substrate (silicon substrate), for example. In the example shown in the drawing, the movable body 20, the supports 30 and 32, and the fixed portion 40 configure one structure (silicon structure) 2. A material of the structure 2 is, for example, silicon to which conductivity is applied by doping with an impurity such as phosphorus or boron. In a case where the material of substrate 10 is glass and the material of the structure 2 is silicon, the substrate 10 and the fixed portion 40 are bonded to each other by anode bonding, for example.

In the physical quantity sensor 100, the structure 2 is fixed to the substrate 10 by one fixed portion 40. That is, the structure 2 is fixed to the substrate 10 at one point (one fixed portion 40). Accordingly, it is possible to reduce the influence of stress generated due to a difference between a coefficient of thermal expansion of the substrate 10 and a coefficient of thermal expansion of the structure 2, stress applied to a device when mounting the device, or the like, on the supports 30 and 32, compared to a case where the structure 2 is fixed to the substrate 10 at two points (two fixed portions 40), for example (refer to FIGS. 12 and 13, for example).

The first fixed electrode portion 50 is provided on the substrate 10. The first fixed electrode portion 50 is disposed to oppose the first movable electrode portion 21. The first movable electrode portion 21 is positioned above the first fixed electrode portion 50 with a gap interposed therebetween. When the movable body 20 is divided into the first seesaw piece 20a and the second seesaw piece 20b with the support shaft Q as a boundary, the first fixed electrode portion 50 is disposed on the substrate 10 to oppose the first seesaw piece 20a.

The second fixed electrode portion 52 is provided on the substrate 10. The second fixed electrode portion 52 is disposed to oppose the second movable electrode portion 22.

The second movable electrode portion 22 is positioned on the second fixed electrode portion 52 with a gap interposed therebetween. When the movable body 20 is divided into the first seesaw piece 20a and the second seesaw piece 20b with the support shaft Q as a boundary, the second fixed electrode portion 52 is disposed on the substrate 10 to oppose the second seesaw piece 20b.

An area of the first fixed electrode portion 50 of the portion opposing the movable body 20 and an area of the second fixed electrode portion 52 of the portion opposing the movable body 20 are equivalent to each other. The planar shape of the first fixed electrode portion 50 and the planar shape of the second fixed electrode portion 52 are symmetrical about the support shaft Q, for example.

The first fixed electrode portion 50 is provided between the guard portions 60 and 62. That is, the number of electrodes 61 adjacent to first fixed electrode portion 50 is two. In addition, the second fixed electrode portion 52 is provided between the guard portion 60 and the electrode 64. That is, the number of electrodes 61 and 64 adjacent to the second fixed electrode portion 52 is two. As described above, in the physical quantity sensor 100, the number of electrodes 61 adjacent to the first fixed electrode portion 50 and the number of electrodes 61 and 64 adjacent to the second fixed electrode portion 52 are equivalent to each other.

Although not shown, the first fixed electrode portion 50 may be provided in a position of the cover 70 opposing the first movable electrode portion 21, and the second fixed electrode portion 52 may be provided in a position of the cover 70 opposing the second movable electrode portion 22.

The guard portions 60 and 62 are members for suppressing an electrostatic force acting between the movable body 20 and the substrate 10 and an electrostatic force acting between the supports 30 and 32 and the substrate 10. In the example shown in the drawing, the guard portions 60 and 62 are electrodes 61 electrically connected to the movable body 20.

The guard portion 60 is provided in an area (first area, inter-electrode area) 14a between the first fixed electrode portion 50 and the second fixed electrode portion 52 of the substrate 10, in a plan view. In the example shown in the drawing, the area 14a of the substrate 10 includes an area overlapped with the movable body 20 (first seesaw piece 20a and second seesaw piece 20b) and an area overlapped with the supports 30 and 32 (second area), in a plan view.

The electrode 61 configuring the guard portion 60 is disposed to oppose the movable body 20 and the supports 30 and 32. That is, the electrode 61 configuring the guard portion 60 is overlapped with the movable body 20 (first seesaw piece 20a and second seesaw piece 20b) and the supports 30 and 32, in a plan view. The movable body 20 (first seesaw piece 20a and second seesaw piece 20b) and the supports 30 and 32 are disposed on the electrode 61 configuring the guard portion 60, with a gap interposed therebetween.

The guard portion 62 is provided in an area overlapped with the first seesaw piece 20a of the substrate 10, and in the area 14b in a negative X axis direction of the first fixed electrode portion 50 in a plan view. The guard portion 62 is provided in a position overlapped with the movable body 20 on the substrate 10 in a plan view, and on the outside of the first fixed electrode portion 50, the second fixed electrode portion 52, and the first area 14a. The guard portion 62 is provided in a position overlapped with the movable body 20 on the substrate 10 in a plan view to avoid the first fixed electrode portion 50, the second fixed electrode portion 52, and the first area 14a. The electrode 61 configuring the guard portion 62 is disposed to oppose the first seesaw piece 20a. That is, the electrode 61 configuring the guard portion 62 is overlapped with the first seesaw piece 20a in a plan view. The first seesaw piece 20a is positioned on the electrode 61 configuring the guard portion 62 with a gap interposed therebetween.

The electrode 64 is provided in an area 14c in the positive X axis direction of the second fixed electrode portion 52. In the example shown in the drawing, the electrode 64 is provided in an area not overlapped with the movable body 20. In the example shown in the drawing, the areas 14a, 14b, and 14c of the substrate 10 are a part of the bottom surface 14 of the recess 12.

The electrode 61 configuring the guard portion 60 is electrically connected to the movable body 20 through a wire (not shown) provided on the surface of the post portion 16, the fixed portion 40, and the supports 30 and 32, for example. The electrode 61 configuring the guard portion 62 and the electrode 64 are electrically connected to the electrode 61 of the guard portion 60 by wires (not shown). The movable body 20 and the electrodes 61 and 64 may be electrically connected to each other with a bonding wire (not shown) or the like. In the physical quantity sensor 100, since each electrode 61 is electrically connected to the movable body 20, it is possible to make each electrode 61 and the movable body 20 to be equipotential. Therefore, it is possible to suppress the electrostatic force acting between the structure 2 (movable body 20) and the substrate 10.

The material of the fixed electrode portions 50 and 52, the electrode 61 configuring the guard portions 60 and 62, and the electrode 64 is, for example, aluminum, gold, indium tin oxide (ITO), or the like. The material of the fixed electrode portions 50 and 52, the electrodes 61 configuring the guard portions 60 and 62, and the electrode 64 is desirably a transparent electrode material such as ITO. This is because a foreign material or the like existing on the fixed electrode portions 50 and 52, the electrodes 61 configuring the guard portions 60 and 62, and the electrode 64 can be easily visually recognized, by using the transparent electrode material as the material of the fixed electrode portions 50 and 52, the electrodes 61 configuring the guard portions 60 and 62, and the electrode 64, in a case where the substrate 10 is a transparent substrate (glass substrate).

The cover 70 is provided on the substrate 10. The cover 70 is bonded to the substrate 10. The cover 70 and the substrate 10 form a cavity 72 for accommodating the movable body 20. The cavity 72 is under an inert gas (for example, nitrogen gas) atmosphere, for example. The material of the cover 70 is silicon, for example. When the material of the cover 70 is silicon and the material of the substrate 10 is glass, the substrate 10 and the fixed portion 40 are bonded to each other by anode bonding, for example.

Next, an operation of the physical quantity sensor 100 will be described.

In the physical quantity sensor 100, the movable body 20 swings around the support shaft Q, according to a physical quantity such as acceleration or angular velocity. A distance between the first movable electrode portion 21 and the first fixed electrode portion 50, and a distance between the second movable electrode portion 22 and the second fixed electrode portion 52 are changed according to the movement of the movable body 20.

In detail, when the acceleration vertically upward (positive Z axis direction) is applied to the physical quantity sensor 100, the movable body 20 rotates counterclockwise, a distance between the first movable electrode portion 21 and the first fixed electrode portion 50 decreases, and a distance between the second movable electrode portion 22 and the second fixed electrode portion 52 increases. As a result, the capacitance C1 increases and the capacitance C2 decreases.

When the acceleration vertically downward (negative Z axis direction) is applied to the physical quantity sensor 100, for example, the movable body 20 rotates clockwise, the distance between the first movable electrode portion 21 and the first fixed electrode portion 50 increases, and the distance between the second movable electrode portion 22 and the second fixed electrode portion 52 decreases. As a result, the capacitance C1 decreases and the capacitance C2 increases. Accordingly, it is possible to detect a physical quantity such as a direction or a size of the acceleration, the angular velocity, or the like, based on the difference between the capacitance C1 and the capacitance C2 (so-called differential detection system).

As described above, the physical quantity sensor 100 can be used as an inertial sensor such as an acceleration sensor or a gyro sensor, and in detail, the physical quantity sensor can be used as a capacitance type acceleration sensor for measuring the acceleration in the vertical direction (Z axis direction).

The physical quantity sensor 100 has the following properties, for example.

The physical quantity sensor 100 includes the substrate 10, the movable body 20 including the movable electrode portions 21 and 22, and the support 30 which supports so as to displace the movable body 20 around the support shaft Q, and when the movable body 20 is divided into the first seesaw piece 20a and the second seesaw piece 20b with the support shaft Q as a boundary, the physical quantity sensor includes the first fixed electrode portion 50 which is disposed on the substrate 10 to oppose the first seesaw piece 20a, and the second fixed electrode portion 52 which is disposed on the substrate 10 to oppose the second seesaw piece 20b, and the guard portion 60 which suppresses the electrostatic force generated between the movable body 20 and the substrate 10 is provided in the inter-electrode area 14a between the first fixed electrode portion 50 and the second fixed electrode portion 52, on the substrate 10. Accordingly, it is possible to suppress the electrostatic force acting between the movable body 20 and the substrate 10 and to prevent the movable body 20 from being stuck to the substrate 10. Therefore, the movable body 20 is not stuck to the substrate 10 due to the movable body 20 being pulled to the substrate 10 side by the electrostatic force, due to generation of a difference in potential between the movable body 20 and the substrate 10, when manufacturing the physical quantity sensor 100, for example.

In the physical quantity sensor 100, the guard portion 60 is provided in the position overlapped with the supports 30 and 32 on the substrate 10 in a plan view. Therefore, it is possible to suppress the electrostatic force acting between the supports 30 and 32 and the substrate 10 and to prevent the movable body 20 from being stuck to the substrate 10.

In the physical quantity sensor 100, the guard portion 62 is provided in a position overlapped with the movable body 20 in a plan view, and in the area 14b outside the first fixed electrode portion 50, the second fixed electrode portion 52, and the inter-electrode area 14a. Therefore, it is possible to suppress the electrostatic force acting between the movable body 20 and the substrate 10 and to prevent the movable body from being stuck to the substrate.

In the physical quantity sensor 100, the guard portions 60 and 62 are electrodes 61 electrically connected to the movable body 20. Therefore, it is possible to reduce the difference in potential between the movable body 20 and the supports 30 and 32, and the electrodes 61 (or to make not to generate the difference in potential thereof). Therefore, it is possible to suppress the electrostatic force acting between the movable body 20 and the supports 30 and 32, and the substrate 10, and to prevent the movable body 20 from being stuck to the substrate 10.

In the physical quantity sensor 100, the number of electrodes 61 adjacent to the first fixed electrode portion 50 and the number of electrodes 61 and 64 adjacent to the second fixed electrode portion 52 are equivalent to each other. Therefore, it is possible to easily set parasitic capacitance generated between the first fixed electrode portion 50 and the electrode 61, and parasitic capacitance generated between the second fixed electrode portion 52 and the electrodes 61 and 64, to be equivalent to each other. Accordingly, it is possible to reduce an influence of the parasitic capacitance on the first fixed electrode portion 50 and an influence of the parasitic capacitance on the second fixed electrode portion 52, by using the differential detection system.

1.2. Manufacturing Method of Physical Quantity Sensor

Figure 3:
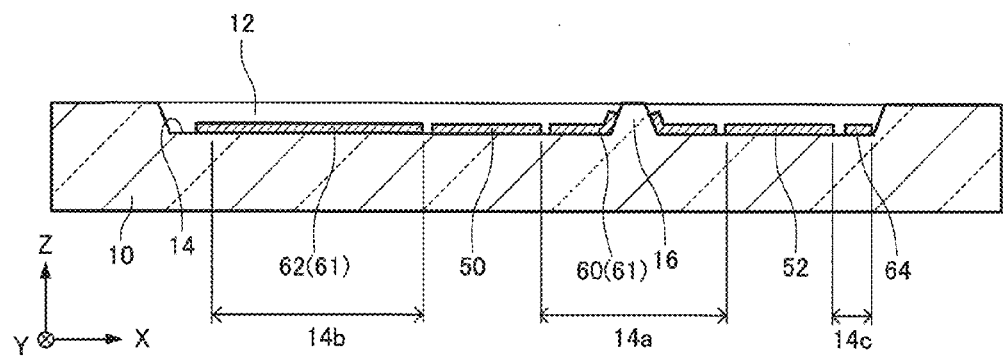
FIG. 3 is a cross-sectional view schematically showing a manufacturing step of the physical quantity sensor according to the first embodiment.
Figure 4:
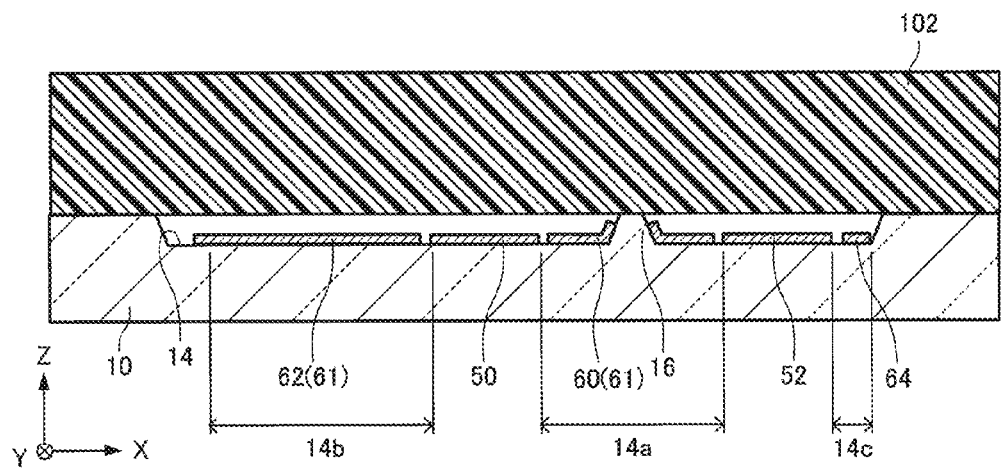
FIG. 4 is a cross-sectional view schematically showing the manufacturing step of the physical quantity sensor according to the first embodiment.
Figure 5:
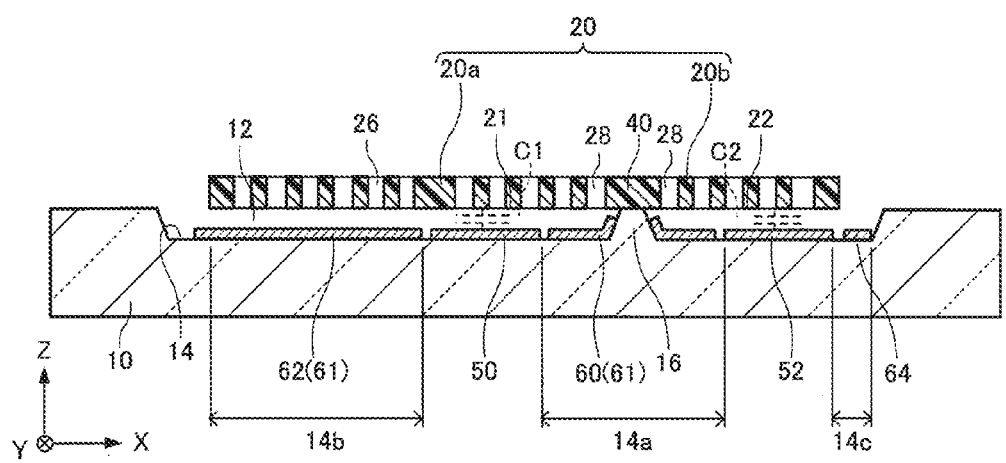
FIG. 5 is a cross-sectional view schematically showing the manufacturing step of the physical quantity sensor according to the first embodiment.

Next, a manufacturing method of the physical quantity sensor according to the first embodiment will be described with reference to the drawings. FIG. 3 to FIG. 5 are cross-sectional views schematically showing manufacturing steps of the physical quantity sensor 100 according to the first embodiment.

As shown in FIG. 3, for example, a glass substrate is patterned to form the substrate 10 on which the recess 12 and the post portion 16 are formed. The patterning of the glass substrate is performed by photolithography and etching, for example.

Next, the fixed electrode portions 50 and 52, the electrodes 61 configuring the guard portions 60 and 62, and the electrode 64 are formed on the bottom surface 14 of the recess 12. The fixed electrode portions 50 and 52, the electrodes 61 configuring the guard portions 60 and 62, and the electrode 64 are formed by forming a conductive layer on the bottom surface 14 by a sputtering method or the like, and patterning the conductive layer by photolithography and etching.

As shown in FIG. 4, a silicon substrate 102 is bonded to the substrate 10. The bonding of the substrate 10 and the silicon substrate 102 is performed by anode bonding, for example.

As shown in FIG. 5, the silicon substrate 102 is ground to manufacture a thin film for patterning by a grinding machine, for example, and accordingly the movable body 20, the supports 30 and 32, and the fixed portion 40 are integrally formed. The patterning is performed by photolithography and etching (dry etching), and a Bosch method can be used as a more specific etching technology.

As shown in FIG. 2, the cover 70 is bonded to the substrate 10, and the movable body 20 or the like is accommodated in the cavity 72 formed by the substrate 10 and the cover 70. The bonding of the cover 70 to the substrate 10 is performed by anode bonding, for example. This step is performed in the inert gas atmosphere so as to fill the inert gas in the cavity 72.

In the step, a great difference in potential is generated between the structure 2 including the movable body 20, the supports 30 and 32, and the fixed portion 40, and the substrate 10, when bonding the cover 70 to the substrate 10. However, it is possible to suppress the electro static force acting between the movable body 20 and the supports 30 and 32, and the substrate 10 by the guard portions 60 and 62. Therefore, it is possible to prevent the movable body 20 from being stuck to the substrate 10.

It is possible to manufacture the physical quantity sensor 100 by the steps described above.

1.3. Modification Examples

Next, Modification Examples of the physical quantity sensors according to of the first embodiment will be described with reference to the drawings. Regarding physical quantity sensors 200, 300, and 400 according to Modification Examples described below, the same reference numerals are used for the members having the same functions as the constituent elements of the physical quantity sensor 100 described above, and the description thereof will be omitted.

1. First Modification Example

Figure 6:
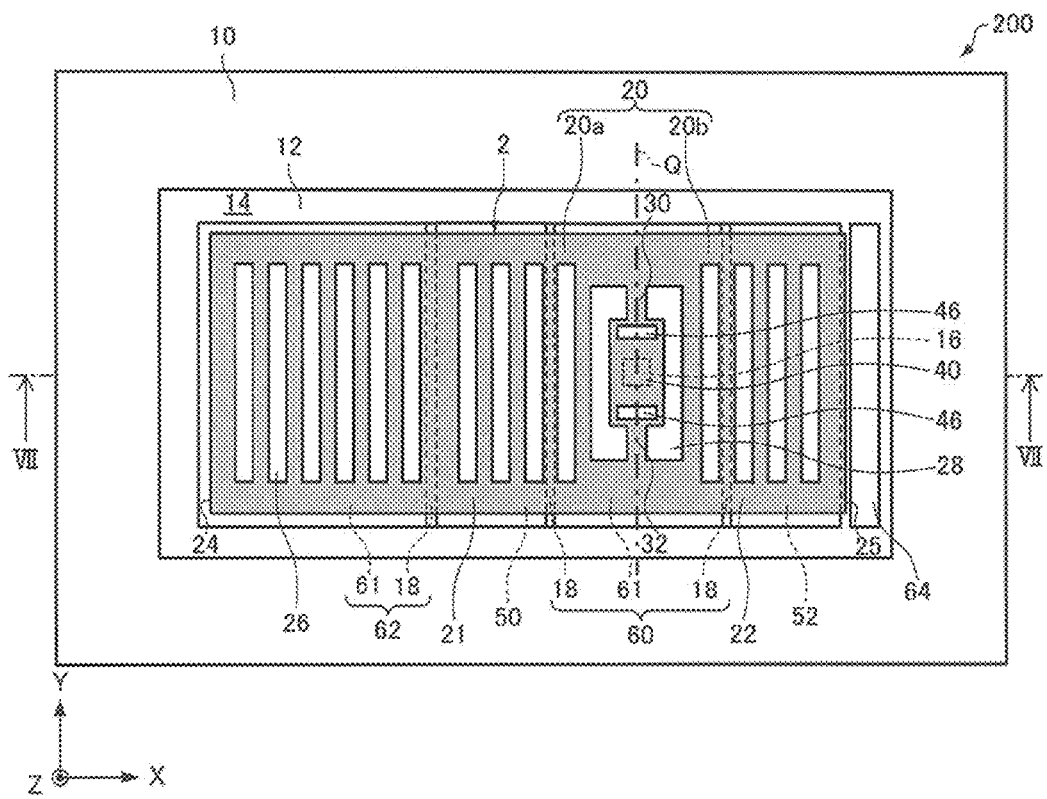
FIG. 6 is a plan view schematically showing a physical quantity sensor according to First Modification Example of the first embodiment.
Figure 7:
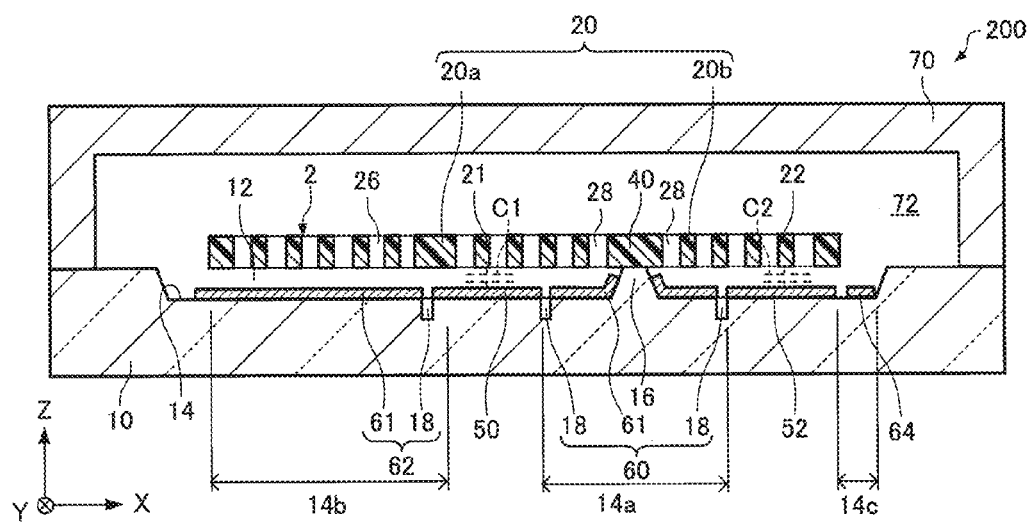
FIG. 7 is a cross-sectional view schematically showing the physical quantity sensor according to First Modification Example of the first embodiment.

First, First Modification Example will be described. FIG. 6 is a plan view schematically showing the physical quantity sensor 200 according to First Modification Example. FIG. 7 is a cross-sectional view taken along line VII-VII of FIG. 6 and schematically showing the physical quantity sensor 200 according to First Modification Example. For convenience, the cover 70 is omitted in FIG. 6.

As shown in FIG. 1 and FIG. 2, in the example of the physical quantity sensor 100 described above, the guard portions 60 and 62 are configured with the electrodes 61 electrically connected to the movable body 20.

With respect thereto, in the physical quantity sensor 200, as shown in FIG. 6 and FIG. 7, the guard portions 60 and 62 include the electrode 61 electrically connected to the movable body 20 and groove portions 18 provided on the substrate 10.

In the example shown in the drawing, the guard portion 60 is configured with one electrode 61 and two groove portions 18. In the guard portion 60, the groove portions 18 are provided in an area between the first fixed electrode portion 50 of the substrate 10 and the electrode 61 configuring the guard portion 60 in a plan view, and an area between the second fixed electrode portion 52 of the substrate 10 and the electrode 61 configuring the guard portion 60.

The groove portions 18 are provided on the bottom surface 14 of the recess 12. The groove portions 18 include a bottom surface (surface opposing the movable body 20, inner bottom surface) having a greater distance between the groove portions and the movable body 20, than that of the bottom surface 14 of the recess 12. By forming the groove portions 18, it is possible to increase the distance between the substrate 10 and the movable body 20.

Herein, the magnitude of the electrostatic force is inversely proportional to the square of the distance. Accordingly, by forming the groove portions 18, it is possible to suppress the electrostatic force acting between the substrate 10 and the movable body 20. The depth of the groove portions 18 is not particularly limited, as long as it is a depth at which the substrate 10 and the movable body 20 are not stuck to each other by the electrostatic force.

In the example shown in the drawing, the guard portion 62 is configured with one electrode 61 and one groove portion 18. In the guard portion 62, the groove portion 18 is provided in an area between the first fixed electrode portion 50 of the substrate 10 and the electrode 61 configuring the guard portion 62 in a plan view.

In the physical quantity sensor 200, the guard portion 60 includes the electrode 61 which is provided in the first area 14a and electrically connected to the movable body 20, and the groove portions 18 which are provided in the area between the electrode 61 configuring the guard portion 60 of the substrate 10 and the first fixed electrode portion 50 and the area between the electrode 61 configuring the guard portion 60 of the substrate 10 and the second fixed electrode portion 52. Therefore, it is possible to suppress the electrostatic force acting between the movable body 20 and the supports 30 and 32, and the substrate 10 by the electrode 61 and the groove portion 18, and to prevent the movable body 20 from being stuck to the substrate 10.

A manufacturing method of the physical quantity sensor 200 is the same as the manufacturing method of the physical quantity sensor 100 described above, except for adding a step of forming the groove portions 18 on the bottom surface 14 of the recess 12 by etching, and therefore the description thereof will be omitted.

Although not shown, the guard portion 60 may only be configured with the groove portion 18. That is, in FIG. 6 and FIG. 7, the electrode 61 configuring the guard portion 60 may be set as the groove portion 18. In detail, the entire first area 14a (except post portion 16) may be set as the groove portion 18. Also in this case, it is possible to suppress the electrostatic force acting between the movable body 20 and the supports 30 and 32, and the substrate 10 and to prevent the movable body 20 from being stuck to the substrate 10. In the same manner as described above, the guard portion 62 may only be configured with the groove portion 18.

Although not shown, the electrode 61 may be provided on the bottom surface (inner bottom surface) of the groove portion 18. The groove portion 18 may be provided in the entire first area 14a (except post portion 16) and the electrode 61 may be provided on the inner bottom surface of the groove portion 18 to be set as the guard portion 60. In the same manner as described above, the groove portion 18 may be provided in the entire second area 14b and the electrode 61 may be provided on the inner bottom surface of the groove portion 18 to be set as the guard portion 62. Also in this case, it is possible to suppress the electrostatic force acting between the movable body 20 and the supports 30 and 32, and the substrate 10 and to prevent the movable body 20 from being stuck to the substrate 10.

2. Second Modification Example

Figure 8:
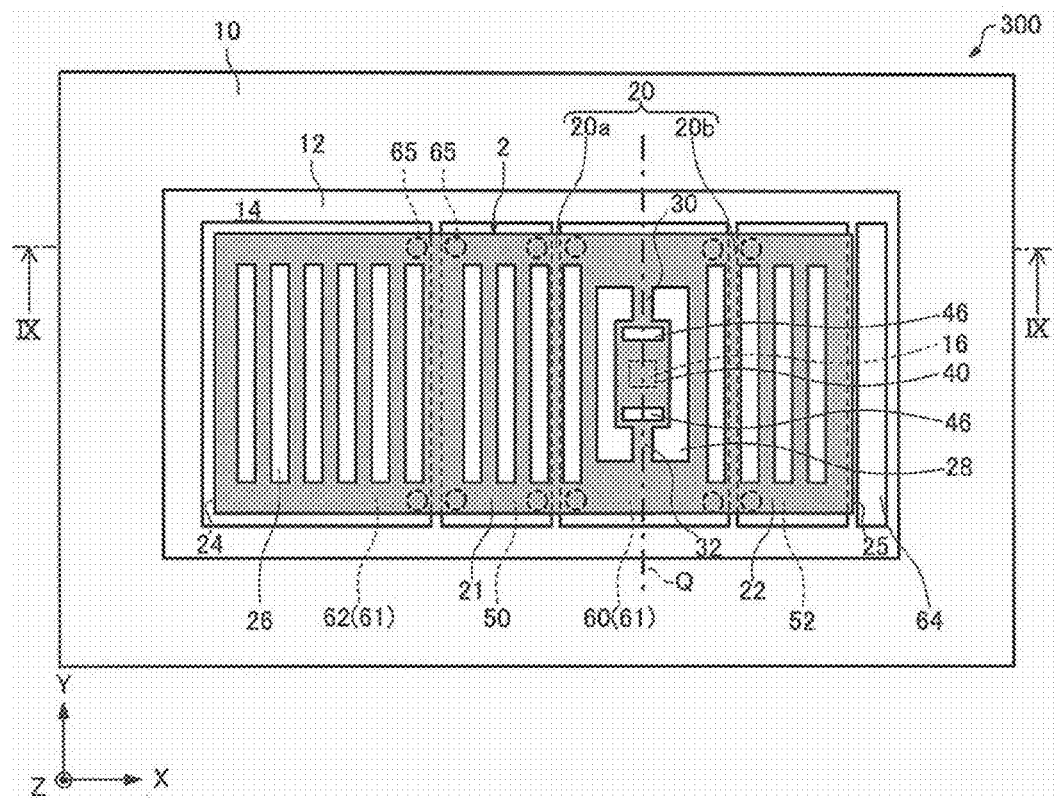
FIG. 8 is a plan view schematically showing a physical quantity sensor according to Second Modification Example of the first embodiment.
Figure 9:
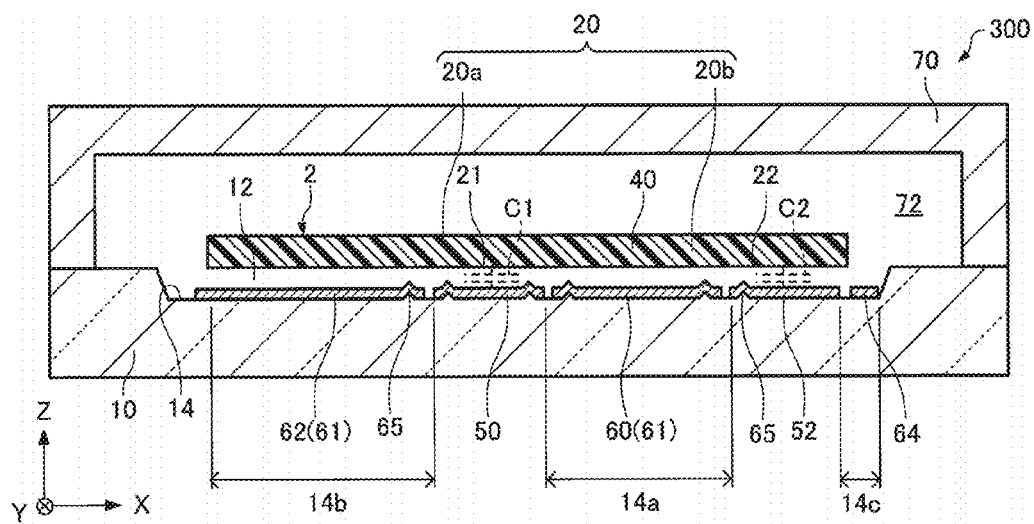
FIG. 9 is a cross-sectional view schematically showing the physical quantity sensor according to Second Modification Example of the first embodiment.

Next, Second Modification Example will be described. FIG. 8 is a plan view schematically showing the physical quantity sensor 300 according to Second Modification Example. FIG. 9 is a cross-sectional view taken along line IX-IX of FIG. 8 and schematically showing the physical quantity sensor 300 according to Second Modification Example. For convenience, the cover 70 is omitted in FIG. 8.

As shown in FIG. 8 and FIG. 9, in the physical quantity sensor 300, protrusion portions 65 are provided on the fixed electrode portions 50 and 52 and the electrodes 61.

The protrusion portions 65 are protruded toward the movable body 20 side from each of electrodes 50, 52, and 61. A shape of the protrusion portions 65 is a spindle shape, for example. The protrusion portions 65 are provided in the area overlapped with the movable body 20 in a plan view. The number or the positions of the protrusion portions 65 are not particularly limited. In the example shown in the drawing, the protrusion portions 65 are provided on both sides of an exposed area of the bottom surface 14 of the substrate 10 (area where the electrodes 50, 52, and 61 are not formed).

In detail, in the example shown in the drawing, the protrusion portions 65 are provided on four corners of the first fixed electrode portion 50 and the second fixed electrode portion 52, four corners of the electrode 61 configuring the guard portion 60, and end portions of the electrode 61 configuring the guard portion 62 on the first fixed electrode portion 50 side.

In the physical quantity sensor 300, the protrusion portions 65 protruded toward the movable body 20 are provided in at least one of the electrode 61, the first fixed electrode portion 50, and the second fixed electrode portion 52. Accordingly, it is possible to prevent the movable body 20 from being stuck to the substrate 10.

A manufacturing method of the physical quantity sensor 300 is the same as the manufacturing method of the physical quantity sensor 100 described above, except for etching so as to form protrusions on the bottom surface 14 when forming the recess 12, and forming conductive layers to be the electrodes 50, 52, and 61 on the protrusions to form the protrusion portions 65, and therefore the description thereof will be omitted.

3. Third Modification Example

Figure 10:
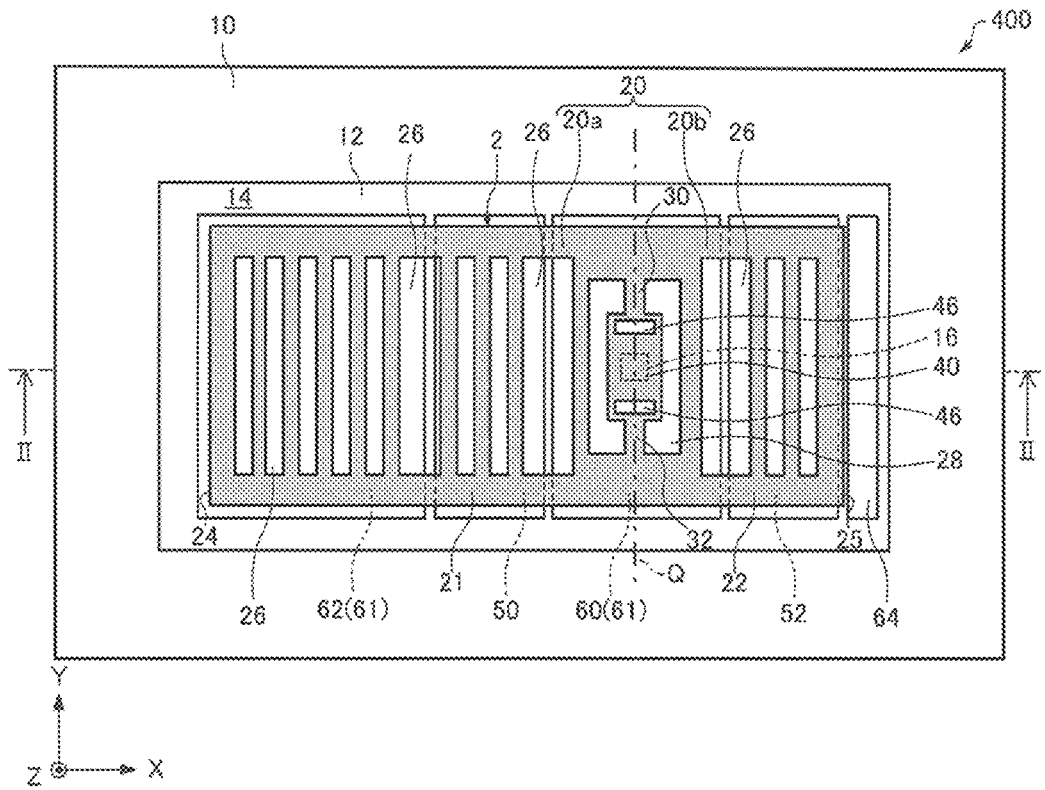
FIG. 10 is a plan view schematically showing a physical quantity sensor according to Third Modification Example of the first embodiment.
Figure 11:
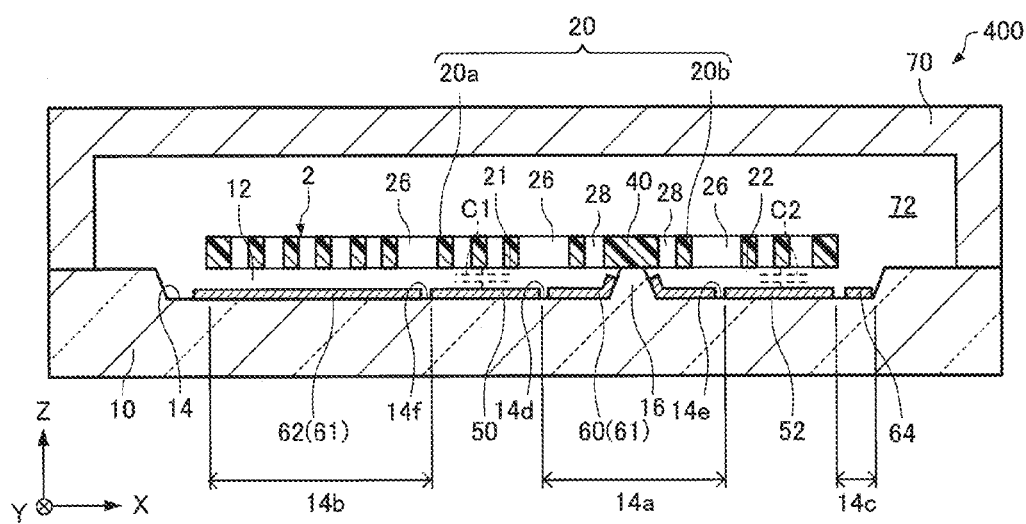
FIG. 11 is a cross-sectional view schematically showing the physical quantity sensor according to Third Modification Example of the first embodiment.

Next, Third Modification Example will be described. FIG. 10 is a plan view schematically showing the physical quantity sensor 400 according to Third Modification Example. FIG. 11 is a cross-sectional view taken along line XI-XI of FIG. 10 and schematically showing the physical quantity sensor 400 according to Third Modification Example. For convenience, the cover 70 is omitted in FIG. 10.

As shown in FIG. 10 and FIG. 11, in the physical quantity sensor 400, the slit portion 26 opposing an area 14d between the electrode 61 configuring the guard portion 60 and the first fixed electrode portion 50 of the substrate 10, is provided on the movable body 20. In addition, the slit portion 26 opposing an area 14e between the electrode 61 configuring the guard portion 60 and the second fixed electrode portion 52 of the substrate 10, is provided on the movable body 20.

Further, the slit portion 26 opposing an area 14f between the electrode 61 configuring the guard portion 62 and the first fixed electrode portion 50 of the substrate 10, is provided on the movable body 20.

In the physical quantity sensor 400, the slit portions 26 opposing the areas 14d, 14e, and 14f to which the substrate 10 is exposed are provided on the movable body 20. Accordingly, it is possible to suppress the electrostatic force acting between the movable body 20 and substrate 10 and to prevent the movable body 20 from being stuck to the substrate 10.

4. Fourth Modification Example

Next, Fourth Modification Example will be described. Although not shown, a physical quantity sensor according to Fourth Modification Example is configured to include the groove portions 18 shown in FIG. 7, the protrusion portions 65 shown in FIG. 8 and FIG. 9, and the slit portions 26 shown in FIG. 10 and FIG. 11. Accordingly, it is possible to further reliably prevent the movable body 20 from being stuck to the substrate 10.

2. Second Embodiment

2.1. Physical Quantity Sensor

Figure 12:
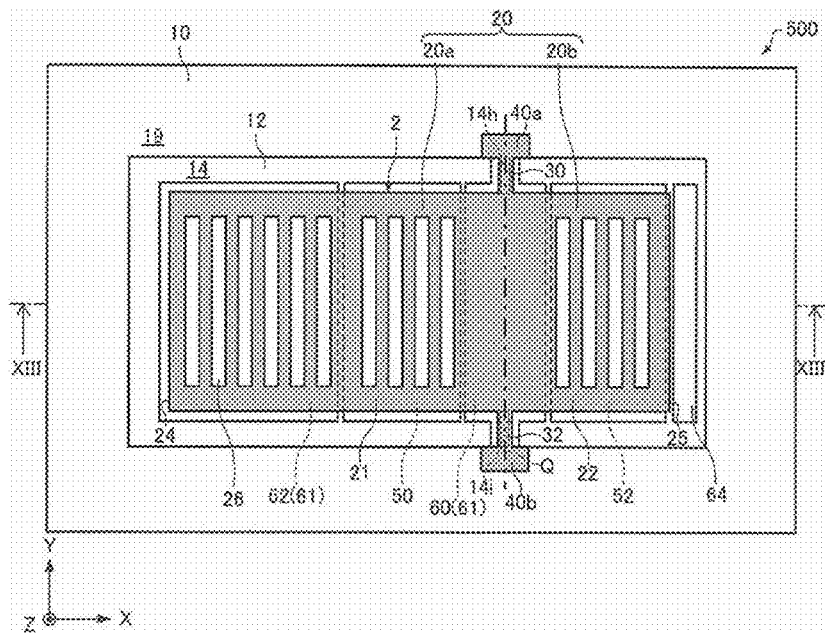
FIG. 12 is a plan view schematically showing a physical quantity sensor according to a second embodiment.
Figure 13:
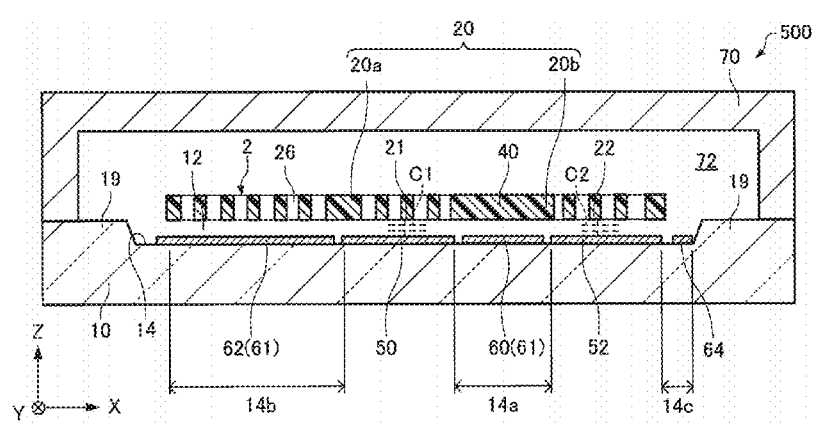
FIG. 13 is a cross-sectional view schematically showing the physical quantity sensor according to the second embodiment.

A physical quantity sensor according to a second embodiment will be described with reference to the drawings. FIG. 12 is a plan view schematically showing a physical quantity sensor 500 according to the second embodiment. FIG. 13 is a cross-sectional view taken along line XIII-XIII of FIG. 12 and schematically showing the physical quantity sensor 500 according to the second embodiment. For convenience, the cover 70 is omitted in FIG. 12.

In the physical quantity sensor 500 according to the second embodiment, the same reference numerals are used for the members having the same functions as the constituent elements of the physical quantity sensor 100 according to the first embodiment described above, and the description thereof will be omitted.

As shown in FIG. 12 and FIG. 13, in the physical quantity sensor 500, the supports 30 and 32 connect fixed portions 40a and 40b provided around the movable body 20 and the movable body 20 to each other, and the guard portion 60 includes the electrode 61 provided in the area (first area, inter-electrode area) 14a between the first fixed electrode portion 50 and the second fixed electrode portion 52 of the substrate 10, and in areas (second area) 14h and 14i overlapped with the support 30 of the substrate 10 in a plan view.

As shown in FIG. 12, the physical quantity sensor 500 includes the first fixed portion 40a and the second fixed portion 40b provided around the movable body 20. In the example shown in the drawing, the fixed portions 40a and 40b are provided in a frame portion 19 of the substrate 10. The fixed portions 40a and 40b and the frame portion 19 are bonded by anode bonding, for example. The first fixed portion 40a is provided in the positive Y axis direction of the movable body 20 and the second fixed portion 40b is provided in the negative Y axis direction of the movable body 20. That is, the movable body 20 is disposed between the first fixed portion 40a and the second fixed portion 40b.

The frame portion 19 of the substrate 10 is provided so as to surround the recess 12. A side surface of the frame portion 19 is a surface for regulating the side surface of the recess 12. The frame portion 19 and the fixed portions 40a and 40b are bonded by anode bonding, for example.

The support 30 connects the first fixed portion 40a and the movable body 20. The support 30 is connected to the side surface of the movable body 20 in the positive Y axis direction. The support 32 connects the second fixed portion 40b and the movable body 20. The support 32 is connected to the side surface of the movable body 20 in the negative Y axis direction.

In the physical quantity sensor 500, the structure 2 is fixed to the substrate 10 by two fixed portions 40. That is, the structure 2 is fixed to the substrate 10 at two points (two fixed portions 40).

The guard portion 60 is configured with the electrode 61 provided in the area 14a of the substrate 10 and the areas 14h and 14i of the substrate 10. The area 14h of the substrate 10 is an area overlapped with the support 30 in a plan view. The area 14i of the substrate 10 is an area overlapped with the support 32 in a plan view. The areas 14h and 14i of the substrate 10 are a part of the bottom surface 14 of the recess 12. In the example shown in the drawing, one electrode 61 is provided over the areas 14a, 14h, and 14i of the substrate 10, but the electrodes 61 may be provided in each of the areas 14a, 14h, and 14i of the substrate 10.

The electrode 61 configuring the guard portion 60 may be extended to the side surface of the recess 12 and the upper surface of the frame portion 19, and may be electrically connected to the fixed portions 40a and 40b. Accordingly, the electrode 61 is electrically connected to the movable body 20 through the first fixed portion 40a and the support 30 (or the second fixed portion 40b and the support 32). Each electrode 61 and the movable body 20 may be electrically connected to each other with a bonding wire (not shown) or the like.

In the physical quantity sensor 500, the guard portion 60 includes the electrode 61 provided in the area 14a between the first fixed electrode portion 50 and the second fixed electrode portion 52 of the substrate 10 and the areas 14h and 14i overlapped with the supports 30 and 32 of the substrate 10 in a plan view. Therefore, it is possible to suppress the electrostatic force acting between the movable body 20 and the supports 30 and 32, and the substrate 10, and to prevent the movable body 20 from being stuck to the substrate 10.

A manufacturing method of the physical quantity sensor 500 is the same as the manufacturing method of the physical quantity sensor 100 described above, except for forming the electrode 61 in the areas 14h and 14i of the substrate 10 and forming two fixed portions 40a and 40b, and therefore the description thereof will be omitted.

2.2 Modification Example

Figure 14:
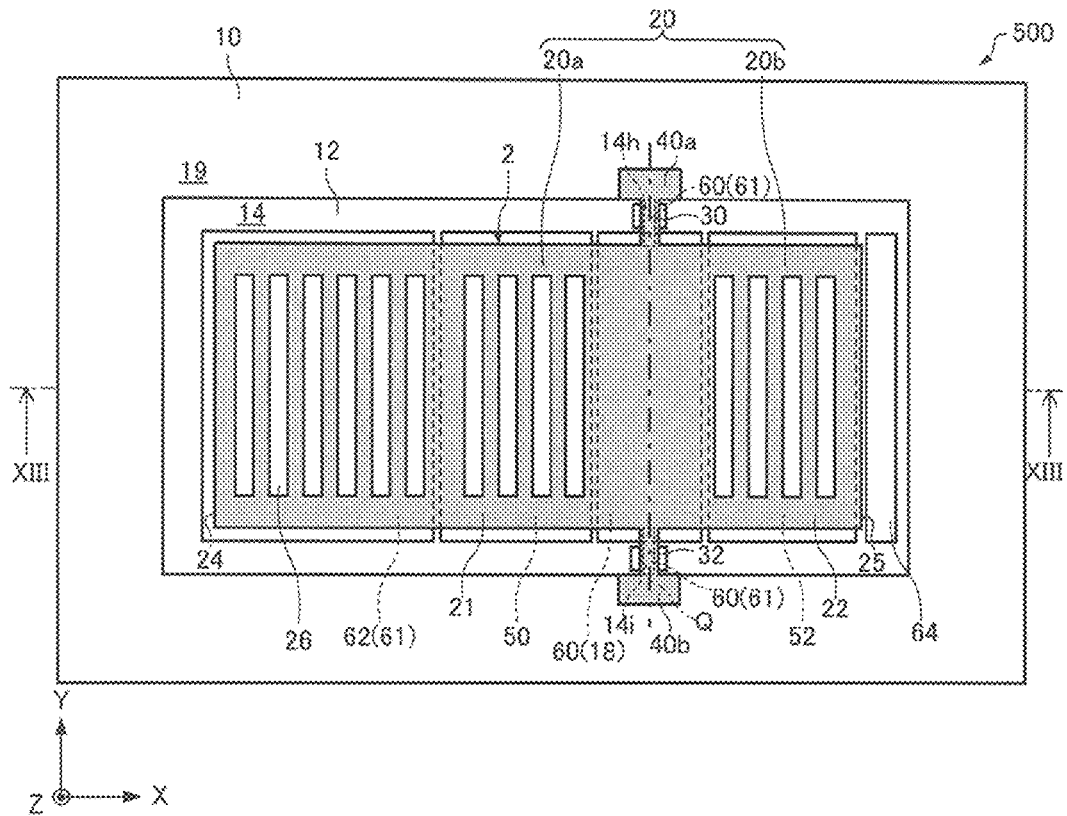
FIG. 14 is a plan view schematically showing a physical quantity sensor according to Modification Example of the second embodiment.
Figure 15:
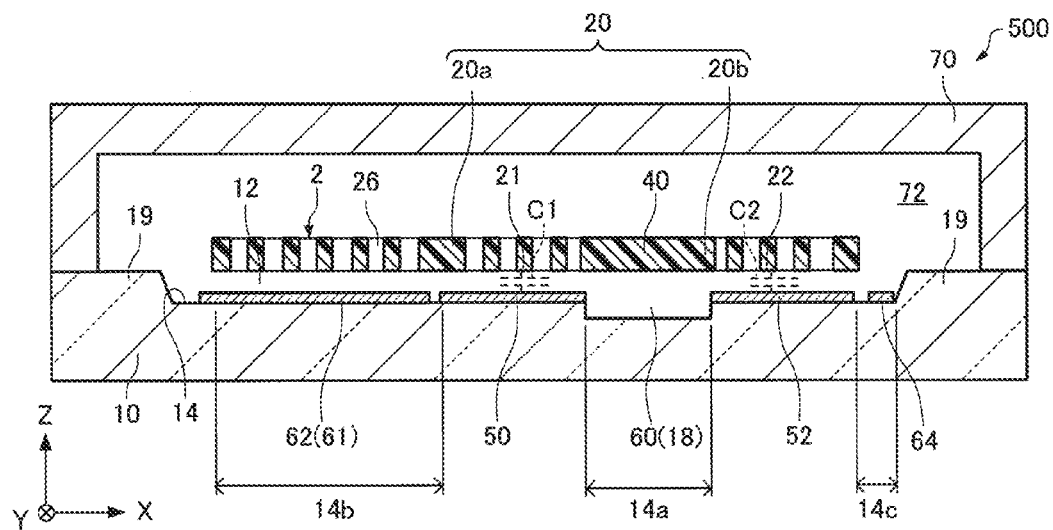
FIG. 15 is a cross-sectional view schematically showing the physical quantity sensor according to Modification Example of the second embodiment.

Next, Modification Example of the physical quantity sensor according to the second embodiment will be described with reference to the drawings. FIG. 14 is a plan view schematically showing a physical quantity sensor 600 according to Modification Example of the second embodiment. FIG. 15 is a cross-sectional view taken along line XV-XV of FIG. 14 and schematically showing the physical quantity sensor 600 according to Modification Example of the second embodiment. For convenience, the cover 70 is omitted in FIG. 14.

In the physical quantity sensor 600 according to the Modification Example, the same reference numerals are used for the members having the same functions as the constituent elements of the physical quantity sensor 500 described above, and the description thereof will be omitted.

As shown in FIG. 12 and FIG. 13, in the example of the physical quantity sensor 500, the guard portion 60 is configured to include the electrode 61 provided in the area (first area) 14a between the first fixed electrode portion 50 and the second fixed electrode portion 52 of the substrate 10, and in the areas (second area) 14h and 14i overlapped with the support 30 of the substrate 10 in a plan view.

With respect to this, as shown in FIG. 14 and FIG. 15, in the physical quantity sensor 600, the guard portion 60 includes the groove portion 18 provided in the area (first area, inter-electrode area) 14a between the first fixed electrode portion 50 and the second fixed electrode portion 52 of the substrate 10, and the electrode 61 provided in the areas (second area) 14h and 14i overlapped with the supports 30 and 32 of the substrate 10 in a plan view. The electrode 61 is electrically connected to the movable body 20.

In the physical quantity sensor 600, it is possible to suppress the electrostatic force acting between the supports 30 and 32 and the substrate 10 by the electrode 61, to suppress the electrostatic force acting between the movable body 20 and the substrate 10 by the groove portion 18, and to prevent the movable body 20 from being stuck to the substrate 10. Although not shown, the electrode 61 may be provided on the inner bottom surface of the groove portion 18.

3. Third Embodiment

Next, an electronic device according to a third embodiment will be described with reference to the drawings. The electronic device according to the third embodiment includes the physical quantity sensor according to the invention. Hereinafter, an electronic device including the physical quantity sensor 100 as the physical quantity sensor according to the invention will be described.

Figure 16:
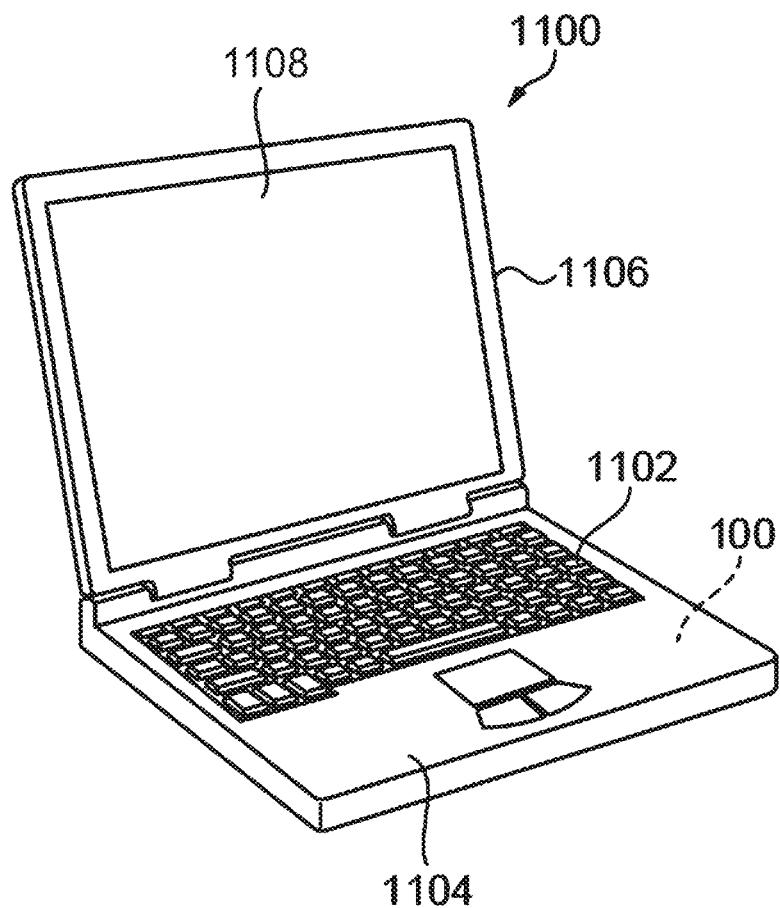
FIG. 16 is a perspective view schematically showing an electronic device according to a third embodiment.

FIG. 16 is a perspective view schematically showing a mobile type (or note type) personal computer 1100 as the electronic device according to the third embodiment.

As shown in FIG. 16, the personal computer 1100 is configured with a main body unit 1104 including a keyboard 1102 and a display unit 1106 including a display unit 1108, and the display unit 1106 is rotatably supported with respect to the main body unit 1104 through a hinge structure portion.

The physical quantity sensor 100 is embedded in such a personal computer 1100.

Figure 17:
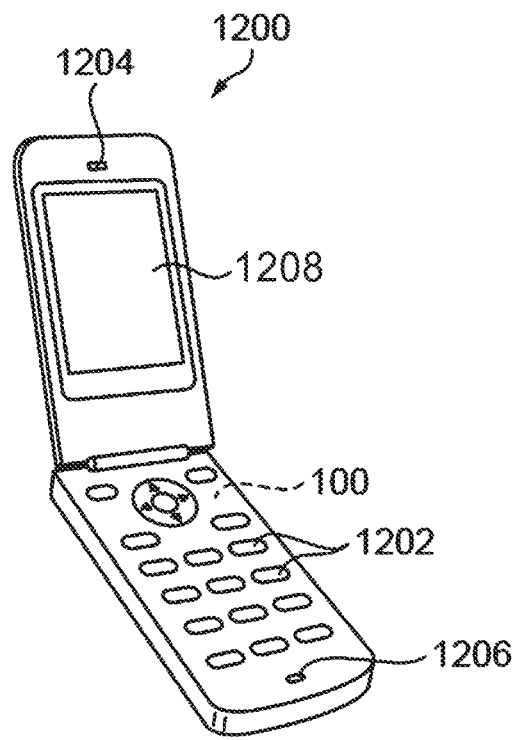
FIG. 17 is a perspective view schematically showing the electronic device according to the third embodiment.

FIG. 17 is a perspective view schematically showing a mobile phone (including a PHS) 1200 as the electronic device according to the third embodiment.

As shown in FIG. 17, the mobile phone 1200 includes a plurality of operation buttons 1202, an earpiece 1204, and a mouthpiece 1206, and a display unit 1208 is disposed between the operation buttons 1202 and the earpiece 1204.

The physical quantity sensor 100 is embedded in such a mobile phone 1200.

Figure 18:
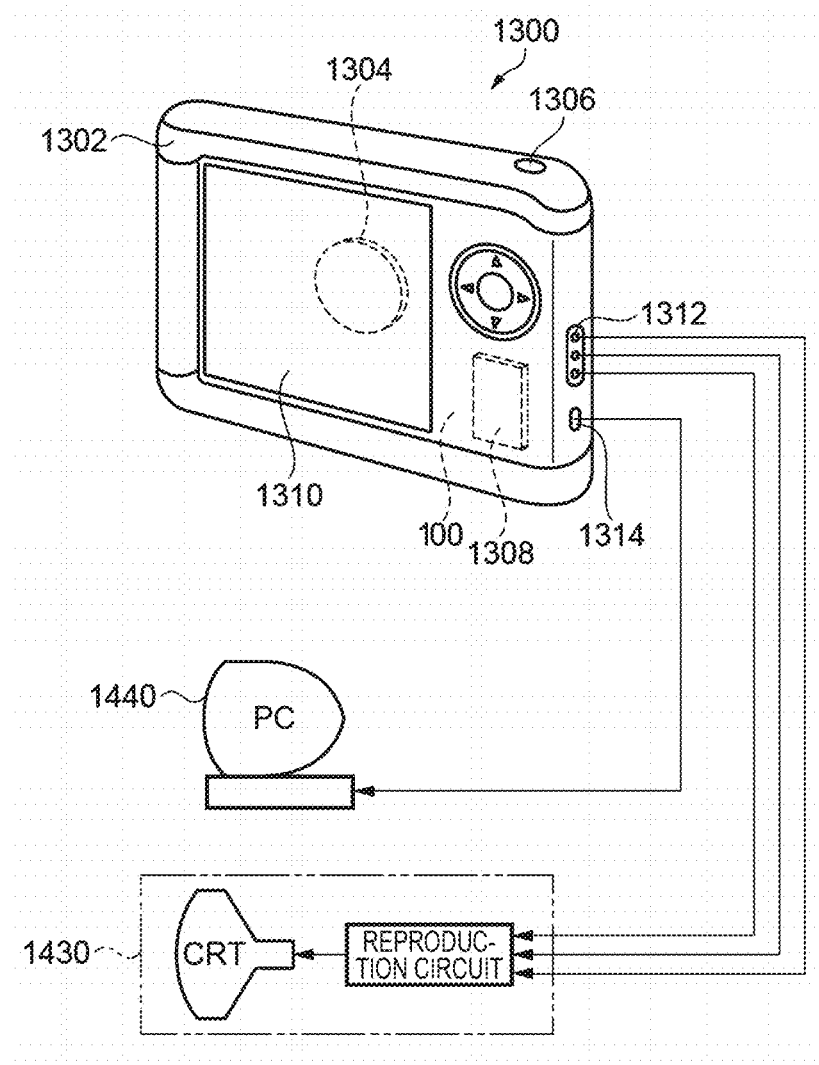
FIG. 18 is a perspective view schematically showing the electronic device according to the third embodiment.

FIG. 18 is a perspective view schematically showing a digital still camera 1300 as the electronic device according to the third embodiment. FIG. 18 also simply shows connection to an external device.

Herein, the digital still camera 1300 generates an imaging signal (image signal) by performing photoelectric conversion of a light image of a subject by an imaging device such as charge coupled device (CCD), whereas a normal camera exposes a silver-halide photo film by using a light image of a subject.

A display unit 1310 is provided on a rear surface of a case (body) 1302 of the digital still camera 1300 and has a configuration for performing a display based on the imaging signal by the CCD, and the display unit 1310 functions as a finder for displaying a subject as an electronic image.

A light receiving unit 1304 including an optical lens (optical imaging system) or the CCD is provided on a front surface side of the case 1302 (back surface side in the drawing).

When a photographer confirms a subject image displayed on the display unit 1310 and presses a shutter button 1306, an imaging signal of CCD at that time point is transmitted and stored in a memory 1308.

In the digital still camera 1300, a video signal output terminal 1312 and a data communication input and output terminal 1314 are provided on a side surface of the case 1302. A television monitor 1430 is connected to the video signal output terminal 1312 and a personal computer 1440 is connected to the data communication input and output terminal 1314, respectively if necessary. In addition, the imaging signal stored in the memory 1308 is output to the television monitor 1430 or the personal computer 1440 by a predetermined operation.

The physical quantity sensor 100 is embedded in the digital still camera 1300.

Since the electronic devices 1100, 1200, and 1300 include the physical quantity sensor 100 which can prevent the movable body 20 from being stuck to the substrate 10, high reliability can be obtained.

In addition to the personal computer (mobile type personal computer) shown in FIG. 16, the mobile phone shown in FIG. 17, and the digital still camera shown in FIG. 18, the electronic device including the physical quantity sensor 100 can be applied to an ink jet type discharging apparatus (for example, ink jet printer), a laptop type personal computer, a television, a video camera, a video camera recorder, various navigation apparatuses, a pager, an electronic organizer (including those having communication function), an electronic dictionary, a calculator, an electronic game device, a head mount display, a word processer, a work station, a video phone, a security monitor, electronic binoculars, a POS terminal, medical equipment (for example, an electronic thermometer, a blood pressure meter, a blood glucose meter, an ECG measuring device, a ultrasound diagnostic device, an electronic endoscope), a fish finder, a variety of measurement equipments, a meter (for example, a meter for vehicles, aircraft, a rocket, or a ship), attitude control of a robot or a human body, a flight simulator, or the like.

4. Fourth Embodiment

Next, a moving object according to a fourth embodiment will be described with reference to the drawings. The moving object according to the fourth embodiment includes the physical quantity sensor according to the invention. Hereinafter, a moving object including the physical quantity sensor 100 as the physical quantity sensor according to the invention will be described.

Figure 19:
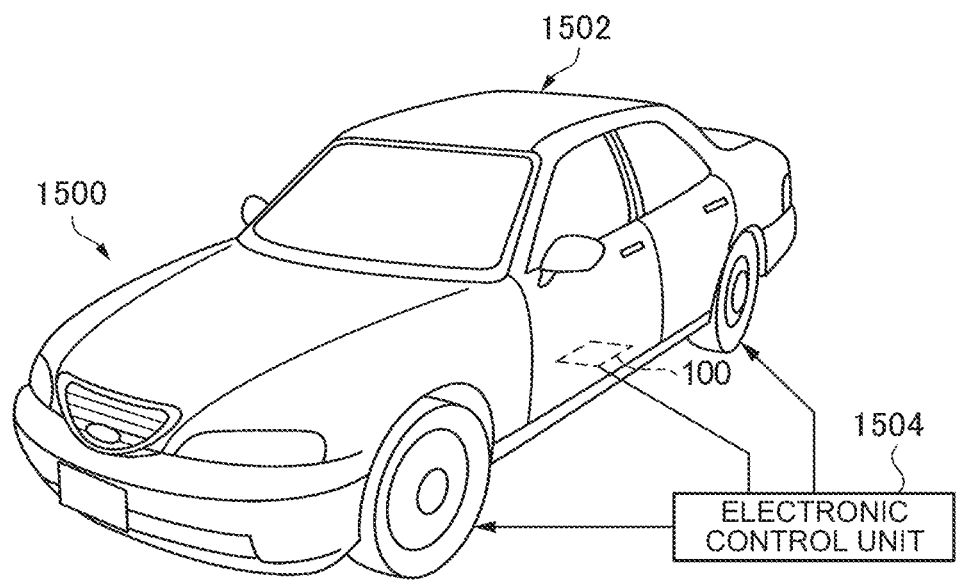
FIG. 19 is a perspective view schematically showing a moving object according to a fourth embodiment.

FIG. 19 is a perspective view schematically showing a vehicle 1500 as the moving object according to the fourth embodiment.

The physical quantity sensor 100 is embedded in the vehicle 1500. In detail, as shown in FIG. 19, an electronic control unit (ECU) 1504 in which the physical quantity sensor 100 for sensing the acceleration of the vehicle 1500 to control output of an engine, is mounted on a body 1502 of the vehicle 1500. The physical quantity sensor 100 can also be widely applied to a vehicle body attitude control unit, an anti-lock brake system (ABS), an airbag, and a tire pressure monitoring system (TPMS).

Since the vehicle 1500 includes the physical quantity sensor 100 which can prevent the movable body 20 from being stuck to the substrate 10, high reliability can be obtained.

The embodiments and Modification Examples are merely examples and the invention is not limited thereto. For example, the embodiments and Modification Examples can be appropriately combined with each other.

The invention includes substantially the same configuration as the configuration described in the embodiments (for example, a configuration having the same functions, methods, and results, or a configuration having the same object and effects). The invention includes a configuration obtained by replacing the non-essential parts of the configuration described in the embodiments. The invention includes a configuration for realizing the same operation results or a configuration for reaching the same object as the configuration described in the embodiments. The invention includes a configuration obtained by adding the related art to the configuration described in the embodiments.

What is claimed is:

1. A physical quantity sensor comprising:
a substrate including a recess;
a movable body including a movable electrode portion and disposed over the recess;
a support which supports the movable body around a first shaft to be displaced; and
a post provided on a bottom surface of the recess and protruding toward the movable body, wherein the post engages the support to support the movable body,
wherein the support is centered on an axis of the movable body, the axis extending through the first shaft, and includes a plurality of penetration holes disposed on the axis on opposing sides of a fixed portion, the fixed portion being connected to a post portion provided on the substrate and supporting the movable body for rotation about the first shaft,
wherein, when the movable body is divided into a first portion and a second portion with the first shaft as a boundary, the physical quantity sensor includes
a first fixed electrode portion which is disposed on the substrate to oppose the first portion, and
a second fixed electrode portion which is disposed on the substrate to oppose the second portion,
wherein a guard portion which suppresses an electrostatic force generated between the movable body and the substrate is provided in an inter-electrode area between the first fixed electrode portion and the second fixed electrode portion, on the substrate, an electrode configuring the guard portion being electrically connected to the movable body such that the electrode configuring the guard portion and the movable body are equipotential, and
wherein an exposed surface of the substrate between the substrate and the movable body is formed from insulating material, effectively reducing the electrostatic force that occurs between the substrate and the movable body.

2. The physical quantity sensor according to claim 1, wherein the guard portion is provided in a position overlapped with the support on the substrate in a plan view.

3. The physical quantity sensor according to claim 1, wherein the guard portion is provided in a position overlapped with the movable body in a plan view and outside the first fixed electrode portion, the second fixed electrode portion, and the inter-electrode area.

4. The physical quantity sensor according to claim 1, wherein the guard portion is an electrode electrically connected to the movable body.

5. The physical quantity sensor according to claim 4, wherein the electrode of the guard portion is provided in an inner bottom surface of a groove portion provided on the substrate.

6. The physical quantity sensor according to claim 4, wherein groove portions are provided in an area between the electrode and the first fixed electrode portion of the substrate, and an area between the electrode and second fixed electrode portion of the substrate.

7. The physical quantity sensor according to claim 4, wherein the number of the electrodes adjacent to the first fixed electrode portion and the number of the electrodes adjacent to the second fixed electrode portion are equivalent to each other.

8. The physical quantity sensor according to claim 4, wherein a protrusion portion which is protruded to the movable body is provided on at least one of the electrode, the first fixed electrode portion and the second fixed electrode portion.

9. The physical quantity sensor according to claim 1, wherein the guard portion is a groove portion.

10. A physical quantity sensor comprising:
a substrate including a recess;
a movable body including a movable electrode portion and disposed over the recess;
a support which supports the movable body around a first shaft to be displaced; and
a post provided on a bottom surface of the recess and protruding toward the movable body, wherein the post engages the support to support the movable body,
wherein, when the movable body is divided into a first portion and a second portion with the first shaft as a boundary, the physical quantity sensor includes
    a first fixed electrode portion which is disposed on the substrate to oppose the first portion, and
    a second fixed electrode portion which is disposed on the substrate to oppose the second portion, wherein a guard portion which suppresses an electrostatic force generated between the movable body and the substrate is provided in an inter-electrode area between the first fixed electrode portion and the second fixed electrode portion, on the substrate, an electrode configuring the guard portion being electrically connected to the movable body such that the electrode configuring the guard portion and the movable body are equipotential, the guard portion extending along the recess and a wall of the post portion, and wherein an exposed surface of the substrate between the substrate and the movable body is formed from insulating material, effectively reducing the electrostatic force that occurs between the substrate and the movable body.

* * * * *